(12) United States Patent
Khan

(10) Patent No.: US 11,522,096 B2
(45) Date of Patent: Dec. 6, 2022

(54) PEROVSKITE-SILICON TANDEM STRUCTURE AND PHOTON UPCONVERTERS

(71) Applicant: King Fahd University of Petroleum and Minerals, Dhahran (SA)

(72) Inventor: Firoz Khan, Dhahran (SA)

(73) Assignee: King Fahd University of Petroleum and Minerals, Dhahran (SA)

( * ) Notice: Subject to any disclaimer, the term of this patent is extended or adjusted under 35 U.S.C. 154(b) by 459 days.

(21) Appl. No.: 16/807,780

(22) Filed: Mar. 3, 2020

(65) Prior Publication Data

US 2021/0280730 A1    Sep. 9, 2021

(51) Int. Cl.
  *H01L 51/42*   (2006.01)
  *H01L 31/073*  (2012.01)
  *H01L 31/05*   (2014.01)
  *H01L 31/032*  (2006.01)

(52) U.S. Cl.
  CPC ........ *H01L 31/073* (2013.01); *H01L 31/0325* (2013.01); *H01L 31/0516* (2013.01)

(58) Field of Classification Search
  CPC ..... H01L 31/073; H01L 31/05; H01L 31/032; H01L 31/054
  See application file for complete search history.

(56) References Cited

U.S. PATENT DOCUMENTS

| | | | |
|---|---|---|---|
| 2016/0190377 A1* | 6/2016 | Green | H01L 51/4213 438/74 |
| 2018/0019358 A1 | 1/2018 | Ahn | |
| 2018/0019360 A1 | 1/2018 | Mishima et al. | |
| 2018/0374976 A1* | 12/2018 | Peibst | H01L 31/0747 |
| 2019/0081189 A1 | 3/2019 | Mishima et al. | |

* cited by examiner

*Primary Examiner* — Niki Bakhtiari
(74) *Attorney, Agent, or Firm* — Oblon, McClelland, Maier & Neustadt, L.L.P.

(57) ABSTRACT

A perovskite-silicon tandem cell capable of absorbing solar radiation with energy lower than that of 1.12 eV, i.e., the bandgap of crystalline silicon—corresponding to the wavelength of 1100 nm. $Ho^{3+}$ can absorb photons of wavelength range 1120 to 1190 nm, $Tm^{3+}$, 1190 to 1260 nm, and $Er^{3+}$, 1145 to 1580 nm, but up-conversion can be achieved using $Ho^{3+}$, $Tm^{3+}$, and $Er^{3+}$-doped metal oxide, such as $ZrO_2$, in perovskite-silicon tandem solar cells. Doped metal oxides, such as $ZrO_2$ can also work as selective contacts. Such perovskite-silicon tandem structures can achieve over 30% solar energy conversion efficiency.

17 Claims, 5 Drawing Sheets

PEROVSKITE-SILICON TANDEM STRUCTURE AND PHOTON UPCONVERTERS

BACKGROUND OF THE INVENTION

Field of the Invention

The present disclosure relates to solar conversion devices which may offer improved conversion efficiency relative to conventional photovoltaic units, particularly perovskite-silicon tandem devices including up conversion (UC) materials, such as $Ho^{3+}$, $Tm^{3+}$, and/or $Er^{3+}$-containing materials, and methods of making and using such devices

DESCRIPTION OF THE RELATED ART

The solar energy received in one minute on earth is sufficient to fulfill the human energy consumption for a year. Solar cells are used to convert solar energy into electrical energy. About 90% of the photovoltaic market is dominated by silicon due to its large lifetime, non-toxicity, viability, and availability in earth's crust. Present research and development is trending towards enhancing solar cell efficiency, and lowering the cost of the cell/module. The single-junction silicon solar cell has a theoretical efficiency limit of 33%.

New technology based on perovskite-silicon tandem structures has been emerging to enhance light absorption and lower the cost of solar energy. Both single-junction silicon and perovskite-silicon tandem cells are unable to absorb solar radiation with energy lower than that of 1.12 eV, i.e., the bandgap of crystalline silicon, which corresponds to a wavelength of 1100 nm.

Photon up-conversion is a process in which the sequential absorption of two or more low energy photons leads to the emission of single-photon with higher energy. Upconverters absorb high wavelength photons, i.e., greater than 1100 nm, and convert these high wavelength photons to a lower wavelength, i.e., less than 1100 nm, which can be absorbed by a silicon (bottom) cell and be utilized for current generation.

In the past few years, research interest into up-conversion (UC) materials has increased due to their potential application in various fields such as medical diagnosis, lasers, solar cells, television screen generation, color displays, optical storage, and infrared detection. Up-conversion refers to an anti-Stokes phenomenon in which two or more photons (comparatively low energy) are absorbed and the two photons are transformed into one higher energy photon. Usually in up-conversion, photon absorption takes place in the infrared, however, emission occurs in the visible or UV regions.

Generally, rare-earth-ion-doped nanomaterials, such as heavy-metal oxides, germinates, fluorides, or oxyfluorides, are used as upconverters. Such nanomaterials typically work as host materials. Among them, the heavy-metal oxide-based host materials have low phonon/photon energy and high thermal stability, they have been considered promising host materials. It has been found that the number and probability of radiative transitions in the rare-earth-doped $ZrO_2$ have been enhanced due to its low phonon/photon energy of 470 $cm^{-1}$.

The utilization of the solar spectrum by solar cells is limited due to the bandgap ($E_g$) of the materials used for cell fabrication. Because solar cells are not able to absorb the photons of energy lower than the solar cell material's $E_g$, the photons of lower energy than $E_g$ are transmitted without absorption (and without consequent conversion to electrical energy).

Therefore, up-conversion (UC) nanomaterials have potential applications in the field of photovoltaics because they can convert lower energy photons, i.e., higher wavelength, to higher energy photons, i.e., low wavelength. Using up-conversion (UC) nanomaterials, the efficiency of a solar cell can be enhanced beyond its upper theoretical efficiency limit, also known as the Shockley-Queisser efficiency limit. Employing an ideal up-conversion (UC) material(s), the theoretical efficiency limit of monocrystalline silicon (c-Si) of 33% can be boosted to, e.g., 40.2% under normal illumination, i.e., 100 $mW/cm^2$, solar irradiation, referred to herein as "AM1.5G". Furthermore, up-conversion (UC) materials can be potentially implemented into perovskite-silicon tandem solar cells, which have a theoretical upper limit of 43% conversion efficiency, to further boost efficiency.

Various rare-earth ions, including $Ho^{3+}$, $Tm^{3+}$, and $Er^{3+}$, that have been implemented in grading type energy level structures for up-conversion (UC) materials in the infrared solar spectrum. $Ho^{3+}$, $Tm^{3+}$, and $Er^{3+}$ can respectively absorb photons of wavelength range 1120 to 1190 nm, 1190 to 1260 nm, and 1145 to 1580 nm, which are unconverted to photons in the visible range of the solar spectrum, as seen in FIG. 1. However, such rare-earth ions have not been successfully reported in any standard and/or peskovite-silicon implementations. Certain research in this context warrants discussion.

US 2019/0081189 A1 by Mishima et al. (Mishima I) discloses a method for manufacturing a stacked photoelectric conversion device including forming an intermediate transparent conductive layer on a light-receiving surface of a crystalline silicon-based photoelectric conversion unit including a crystalline silicon substrate, and forming a thin-film photoelectric conversion unit on the intermediate transparent conductive layer. Mishima I's device includes a crystalline silicon-based photoelectric conversion unit, an intermediate transparent conductive layer, and a thin-film photoelectric conversion unit. The light-receiving surface of Mishima I's crystalline silicon-based photoelectric conversion unit has a textured surface including a plurality of projections and recesses. The textured surface has an average height of 0.5 μm or more. The intermediate transparent conductive layer fills the recesses of the textured surface and covers the tops of the projections of the textured surface. At least a part of Mishima I's thin-film photoelectric conversion unit is deposited by a wet method. Mishima I does not disclose using a porous silicon layer and requires a textured layer. Mishima I's cell relies on an extended absorption surface for passing light through its silicon layers. Mishima I's tandem structures are also separated by a heterogeneous layer, such as a transparent oxide layer different from the first conductive layer, e.g., titanium oxide versus ITO, or include a layer formed by a method different from the method for the conductive oxide layer, which may serve to suppress volatilization of residual organic material. Mishima I fails to mention using $Ho^{3+}$, $Tm^{3+}$, or $Er^{3+}$ doping, as well as such a doped $ZrO_2$ layer, particularly adjacent to a back contact.

US 2018/0019358 A1 by Ahn (Ahn) discloses a tandem solar cell comprising a perovskite solar cell laminated on a front surface of a crystalline silicon solar cell, a module comprising the tandem solar cell, and a method for manufacturing the same. Ahn describes a nano-electrode structure patterned on a front surface of a front transparent electrode of a solar cell in which a crystalline silicon solar cell and a perovskite solar cell are bonded via a junction layer, such that the optical path of the sunlight incident on the solar cell through the nano-electrode structure can be increased to improve the utilization rate of the light. Ahn's perovskite absorption layer may be laminated on the front surface of the mesoporous layer, but Ahn's mesoporous layer is indicated to be formed of the same metal oxide as its electron transport layer, such as oxides of Ti, Zn, In, Sn, W, Nb, Mo, Mg, Zr, Sr, Yr, La, V, Al, Y, Sc, Sm, Ga, In, or SrTi, preferably ZnO, $TiO_2$, $SnO_2$, $WO_3$, or $TiSrO_3$. Ahn does not disclose a porous silicon layer. Ahn also requires a texture structure, including an i-type amorphous silicon layer and a conductive amorphous silicon layer, sequentially formed on the rear surface of its crystalline silicon substrate. Ahn's texture structure changes the path of the vertical incident light through the rear surface to create a light scattering effect and increase the path of incident light. Ahn fails to mention using $Ho^{3+}$, $Tm^{3+}$, or $Er^{3+}$ doping, as well as such a doped $ZrO_2$ layer, particularly adjacent to a back contact.

US 2018/0019360 A1 by Mishima et al. (Mishima II) discloses a tandem-type photoelectric conversion device including, from a light-incident side: a first photoelectric conversion unit; an anti-reflection layer; a transparent conductive layer; and a second photoelectric conversion unit. Mishima II's first photoelectric conversion unit includes a light absorbing layer including a photosensitive material of perovskite-type crystal structure represented by general formula $R^1NH_3M^1X_3$ or $HC(NH_2)_2M^1X_3$, wherein $R^1$ is an alkyl group, $M_1$ is a divalent metal ion, and X is a halogen. Mishima II's second photoelectric conversion unit includes a light absorbing layer having a bandgap narrower than a bandgap of the light absorbing layer in the first photoelectric conversion unit. Mishima II's anti-reflection layer and transparent conductive layer are in contact with each other, and a refractive index of the anti-reflection layer is lower than a refractive index of the transparent conductive layer.

Mishima II has a top transparent conducting layer without an anti-reflective layer outwardly upon it, but has an intervening anti-reflective layer between its charge transporting layer and second transparent conducting layer, i.e., between the first and second photoelectric conversion units. Mishima II aims to reduce the reflection of light to the perovskite-type photoelectric conversion unit to increase the amount of light captured in the rear photoelectric conversion unit, by providing the anti-reflection layer and transparent conductive layer between these units. Mishima II fails to mention using $Ho^{3+}$, $Tm^{3+}$, or $Er^{3+}$ doping, as well as such a doped $ZrO_2$ layer, particularly adjacent to a back contact.

In light of the above, a need remains for solar conversion devices of improved conversion efficiency, particularly for perovskite-silicon tandem devices including up-conversion (UC) materials, such as $Ho^{3+}$, $Tm^{3+}$+, and/or $Er^{3+}$-containing materials, and methods of making and using such devices.

SUMMARY OF THE INVENTION

Aspects of the invention provide tandem photovoltaic cells comprising, in an order as follows: optionally, an anti-reflection layer; a transparent conductive oxide layer; a hole transport layer; a perovskite layer; a $p^+$-doped porous silicon electron transport layer; an n-type silicon layer; an $n^+$-doped silicon layer as a homojunction with the n-type silicon layer; an hole blocking and/or silicon-passivating layer optionally comprising $SiO_x$ and/or $Al_2O_3$, a metal oxide layer doped with $Ho^{3+}$, $Tm^{3+}$, and/or $Er^{3+}$ metal oxide; and a conductive electrode layer. Such cells may be modified by any permutation of the features described herein, particularly the following.

The metal oxide layer may comprise at least 50 wt. % $ZrO_2$, relative to total metal oxide layer weight. The metal oxide layer may comprise at least 0.00001 at. % $Ho^{3+}$, relative to total metal oxide layer metal stoichiometry. The metal oxide layer may comprise at least 0.00001 at. % $Er^{3+}$, relative to total metal oxide layer metal stoichiometry. The metal oxide layer may comprise at least 0.00001 at. % $Tm^{3+}$, relative to total metal oxide layer metal stoichiometry.

The hole blocking and/or silicon-passivating layer may comprise at least 50 wt. % $SiO_x$ and/or $Al_2O_3$, relative to total hole blocking and/or silicon-passivating layer weight.

The perovskite layer may directly contact the $p^+$-doped porous silicon electron transport layer, and/or the $p^+$-doped porous silicon electron transport layer may directly contact the n-type silicon layer.

Inventive cells may further comprise a plurality of point contacts bridging the hole blocking and/or silicon-passivating layer and the metal oxide layer. Inventive cells may further comprise a plurality of selective contacts bridging the metal oxide layer and the conductive electrode layer.

Inventive cells may comprise no antireflective layer between a charge transporting layer, light absorbing layers, and/or silicon layer.

The perovskite layer may comprise a compound of formula (I)

$$RNH_3PbX_3 \qquad (I),$$

wherein R is an alkyl group and X is a halide, particularly wherein R is methyl or ethyl and X is Br or I.

The metal oxide layer may directly contact the conductive electrode layer, and/or relative to total metal oxide layer weight, the metal oxide layer may comprise at least 75 wt. % $ZrO_2$ and at least 0.00001 at. % $Ho^{3+}$, $Er^{3+}$, and/or $Tm^{3+}$.

The hole blocking and/or silicon-passivating layer may directly contact the metal oxide layer, e.g., comprising at least 75 wt. % $ZrO_2$ and at least 0.00001 at. % $Ho^{3+}$, $Er^{3+}$, and/or $Tm^{3+}$, and the metal oxide layer may directly contact the conductive electrode layer.

Aspects of the invention provide methods of generating electric energy, which methods may comprise irradiating any permutation of the inventive cell described herein with sunlight.

Aspects of the invention provide methods of increasing the electrical conversion efficiency of a tandem perovskite-silicon photovoltaic cell, which method may comprise: including a metal oxide layer doped with $Ho^{3+}$, $Tm^{3+}$, and/or $Er^{3+}$ metal oxide in the cell between a back contact and a passivating layer, beneath a perovskite photoelectric conversion unit and a silicon photoelectric conversion unit in a direction of irradiation. In such methods, relative to total metal oxide layer weight, the metal oxide layer may comprise at least 75 wt. % $ZrO_2$ and at least 0.00001 at. % $Ho^{3+}$, $Er^{3+}$, and/or $Tm^{3+}$.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE INVENTION

Figure 1:
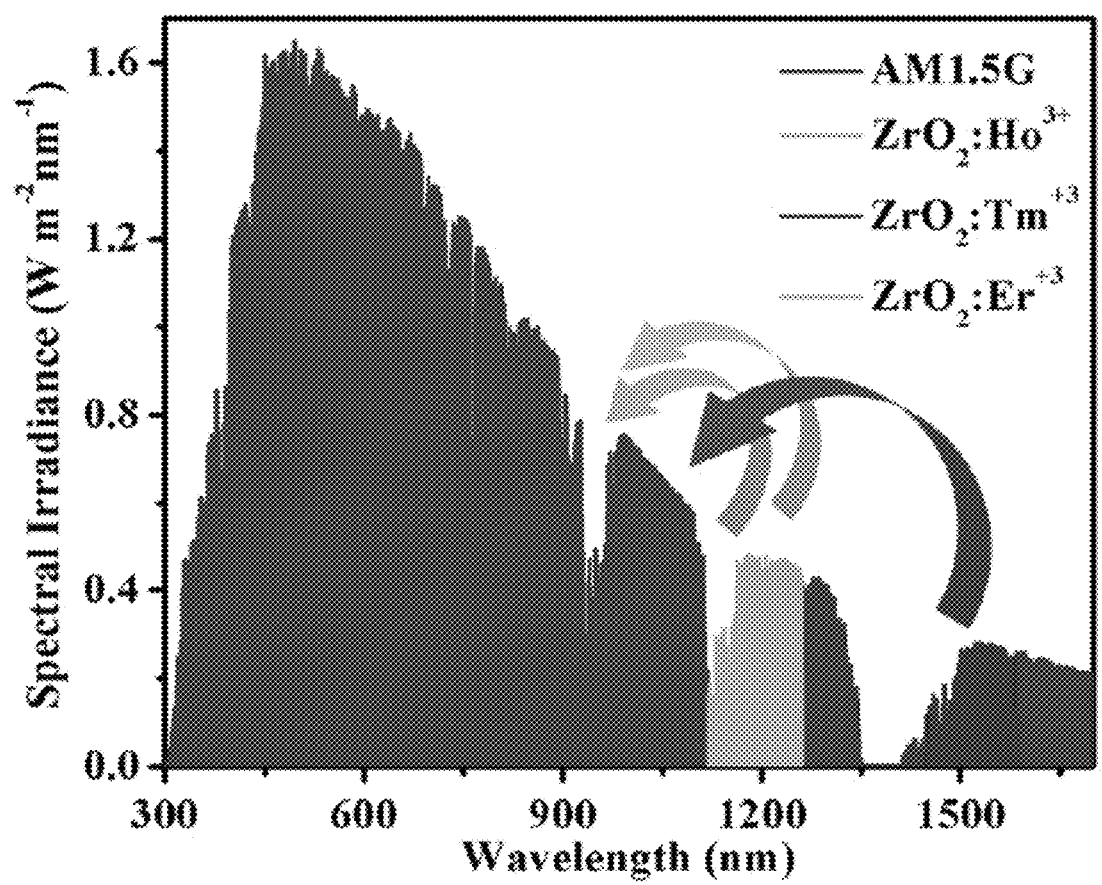
FIG. 1 shows a plot of the spectral irradiance against wavelength of the solar spectrum, referred to as "AM1.5G," and overlap with the up-conversion (UC) materials, $Ho^{3+}$, $Tm^{3+}$, and $Er^{3+}$.

Aspects of the invention provide tandem photovoltaic cells comprising, in an order as follows: optionally, an anti-reflection layer; a transparent conductive oxide layer; a hole transport layer; a perovskite layer; a $p^+$-doped porous silicon electron transport layer; an n-type silicon layer; an $n^+$-doped silicon layer as a homojunction with the n-type silicon layer; a hole blocking and/or silicon-passivating layer typically comprising $SiO_x$ and/or $Al_2O_3$, a metal oxide layer doped with $Ho^{3+}$, $Tm^{3+}$, and/or $Er^{3+}$ metal oxide; and a conductive electrode layer.

Useful anti-reflection (or "anti-reflective") layers may include, for example, a material with an index of refraction (e.g., $n_D$~1.23±0.01, 0.02, 0.03, 0.04, 0.05, 0.06, 0.067, 0.07, 0.075, 0.08, 0.09, 0.1, 0.11, 0.125, 0.133, 0.14, or 0.15, or some range including any of these endpoints) different from the layer immediately beneath it, in an incident light direction, whereby the thickness of the anti-reflection layer(s) should be adjusted to cancel out wavelengths of incident light based on the differences in refractive indices and the thickness of the anti-reflection layer. The anti-reflection layer(s) may be a single layer coating or a multilayer coating (e.g., double-layer antireflective coating, multilayer gradient film, structured surface, etc.). For example, the anti-reflection layer(s) may include $MgF_2$, $SiN_x$, $SiO_2$, $TiZrO_2$, ZnS, SiN, $CeO_2$, ITO, $Si_3N_4$, ZnO, $TiO_2$, a fluoropolymer (PTFE, PVdF, PHFP, etc.), spirooxazine-doped polystyrene, vinyltrimethoxy silane films, AlNX, PRODUCER® DARC® PECVD coating from Applied Materials, and/or any appropriate material described in *Appl. Surf. Sci.* 2019, 490, 278-282, "Multifunctional Optical Coatings and Light Management for Photovoltaics" in *Advanced Micro- and Nanomaterials for Photovoltaics*, S. L. Moffitt, et al., 2019, "Superhydrophobic Antireflective Polymer Coatings with Improved Solar Cell Efficiency" in *Superhydrophobic Polymer Coatings*, S. Sahoo, et al., 2019, "Multifunctional Optical Coatings and Light Management for Photovoltaics" in *Advanced Micro- and Nanomaterials for Photovoltaics* Ch. 7, S. L. Moffit, et al., 2019, pp. 153-173, *Mater. Sci. Appl.*, 2018, 9, 705-722, *Materials* 2016, 9(6), 497, each of which is incorporated by reference herein in its entirety.

Useful hole transport layers may include, for example, any material described in *Arab. J. Chem.* 2020, 13(1), 2526-2557, *J. Phys. Chem. C* 2018, 122(25), 14039-14063, *Adv. Mater. Interf.* 2018, 5(22), 1800882, *J. Mater. Sci.: Mater. Electron.* 2018, 29, 8847, *Chem. Rec.* 2017, 17(7), 681-699, or *Electron. Mater. Lett.* 2019, 15, 505, each of which is incorporated by reference herein in its entirety. Alternatively, or in addition to these, such materials may include NiO, NiO:Cu, $WO_3$, 1,3-bis(N-carbazolyl)benzene, 4,4'-bis(N-carbazolyl)-1,1'-biphenyl, 2,6-bis(9H-carbazol-9-yl)pyridine, 1,4-bis(diphenylamino)benzene, 4,4'-bis(3-ethyl-N-carbazolyl)-1,1'-biphenyl, N,N'-bis(3-methylphenyl)-N,N'-diphenylbenzidine, (E,E)-1,4-bis[2-[4-[N,N-bis(4-methoxyphenyl)amino]phenyl]vinyl]benzene (TOP-HTM-α1), (E,E,E)-4,4',4'',4'''-[benzene-1,2,4,5-tetrayltetrakis(ethene-2,1-diyl)]tetrakis[N,N-bis(4-methoxyphenyl)aniline](TOP-HTM-α2), copper(II) phthalocyanine, cuprous thiocyanate, copper indium sulfide, cuprous iodide, 4,4'-cyclohexylidenebis[N,N-bis(4-methylphenyl)benzenamine], 4-(dibenzylamino)benzaldehyde-N,N-diphenylhydrazone, 9,9'-(2,2'-dimethyl[1,1'-biphenyl]-4,4'-diyl)bis-9H-carbazole, 2,2'-dimethyl-N,N'-di-[(1-naphthyl)-N,N'-diphenyl]-1,1'-biphenyl-4,4'-diamine, 9,9-dimethyl-N,N'-di(1-naphthyl)-N,N'-diphenyl-9H-fluorene-2,7-diamine, N,N'-di(1-naphthyl)-N,N'-diphenyl-(1,1'-biphenyl)-4,4'-diamine, N,N'-diphenyl-N,N'-bis-[4-(phenyl-m-tolylamino)phenyl]biphenyl-4,4'-diamine, N,N'-diphenyl-N,N'-di-p-tolylbenzene-1,4-diamine, dipyrazino[2,3-f:2',3'-h]quinoxaline-2,3,6,7,10,11-hexacarbonitrile, $N^4,N^{4'}$-bis[4-[bis(3-methylphenyl)amino]phenyl]-$N^4,N^{4'}$-diphenyl-[1,1'-biphenyl]-4,4'-diamine (DNTPD), 3-(4,6-diphenyl-1,3,5-triazin-2-yl)-9-phenyl-9H-carbazole (DPTPCz), 9-(2-ethylhexyl)-N,N,N,N-tetrakis((4-methoxyphenyl)-9H-carbazole-2,7-diamine) (EH44), indium(III) phthalocyanine chloride, lead phthalocyanine, poly(copper phthalocyanine), poly(N-ethyl-2-vinylcarbazole), poly-4-butyl-N,N-diphenylaniline (TPD), poly(9-vinylcarbazole), poly(1-vinylnaphthalene), 2,8-bis(diphenylphosphineoxide) dibenzofuran (PPF), poly[bis(4-phenyl)(2,4,6-trimethylphenyl)amine] (PTAA), $N_2,N_2,N_2',N_2',N_7,N_7,N_7',N_7'$-octakis(4-methoxyphenyl)-9,9'-spirobi[9H-fluorene]-2,2',7,7'-tetramine (Spiro-MeOTAD, also sold as SHT-263 Solarpur® HTM), spiro[9H-fluorene-9,9'-[9H]xanthene]-2,7-diamine, spiro[9H-fluorene-9,9'-[9H]xanthene]-2,2',7,7'-tetramine, 2,4,6-tris(3-(carbazol-9-yl)phenyl)triazine (TCPZ), N,N,N',N'-tetrakis(4-methoxyphenyl)benzidine, N,N,N',N'-tetrakis(3-methylphenyl)-3,3'-dimethylbenzidine, N,N,N',N'-tetrakis(2-naphthyl)benzidine, tetra-N-phenylbenzidine, N,N,N',N'-tetraphenylnaphthalene-2,6-diamine, poly[(9,9-dioctylfluorenyl-2,7-diyl)-co-(4,4'-(N-(4-sec-butylphenyl)diphenylamine)] (TFB), tin(IV) 2,3-naphthalocyanine dichloride, titanyl phthalocyanine, titanium oxide phthalocyanine, tris(4-carbazoyl-9-ylphenyl) amine, tris[4-(diethylamino)phenyl]amine, 1,3,5-tris(diphenylamino)benzene, 1,3,5-tris(2-(9-ethylcabazyl-3)ethylene) benzene, 1,3,5-tris[(3-methylphenyl)phenylamino]benzene, 4,4',4''-Tris[2-naphthyl(phenyl)amino]triphenylamine, 4,4',4''-tris[phenyl(m-tolyl)amino]-triphenylamine, vanadyl phthalocyanine, zinc phthalocyanine, or combinations of any of these. Some applications may call for pure, or at least 75, 80, 85, 90, 91, 92, 92.5, 93, 94, 95, 96, 97, 97.5, 98, 99, 99.1, 99.5, or 99.9 wt. % (relative to the total hole transporting layer weight) of inorganic or organic material, or of one, two, three, or four of the aforementioned compounds.

Useful $p^+$-doped porous silicon electron transport layers may include, for example, boron, aluminum, gallium, indium, and/or thallium, or may include purely, or at least 75, 80, 85, 90, 91, 92, 92.5, 93, 94, 95, 96, 97, 97.5, 98, 99, 99.1, 99.5, or 99.9 wt. % (relative to the total $p^+$-doped porous silicon electron transport layer weight), of one of these dopants. The porosity of the p$^+$-doped porous silicon electron transport layers may be, e.g., at least 15, 25, 33, 40, 45, 50, 55, 60, 67, or 75% and/or up to 99, 97.5, 95, 92.5, 90, 85, 80, 75, 70, 60, 50, or 40% porous, and/or may have a dielectric permittivity of, e.g., at least 1.5, 2, 2.5, 3, 3.5, 4, 4.5, or 5 and/or up to 12, 11, 10, 9, 8, 7.5, 7, 6.5, 6, 5.5, or 5.

Useful n-type silicon layers may include, for example, arsenic, phosphorus, antimony, bismuth, and/or lithium, for silicon wafers. For gallium arsenide base material, n-type doping may include tellurium, sulfur (substituting As), tin, silicon, and/or germanium (substituting Ga), and p-type doping may include beryllium, zinc, chromium (substituting Ga), silicon, and/or germanium (substituting As). For gallium phosphide base material, n-type doping may include tellurium, selenium, and/or sulfur (substituting phosphorus), and p-type doping may include zinc, magnesium (substituting Ga), and/or tin (substituting P). For gallium nitride, indium gallium nitride, or aluminium gallium nitride base material, n-type doping may include silicon (substituting Ga), germanium (substituting Ga), and/or carbon (substituting Ga), and p-type doping may include magnesium (substituting Ga). For cadmium telluride base material, n-type doping may include indium, aluminum (substituting Cd), and/or chlorine (substituting Te), and p-type doping may include phosphorus (substituting Te), lithium, and/or sodium (substituting Cd). For cadmium sulfide base material, n-type doping may include gallium (substituting Cd), iodine, and/or fluorine (substituting S), and p-type doping may include lithium and/or sodium (substituting Cd).

Useful n$^+$-doped silicon layers (homojunctions with the n-type silicon layers) may include, for example, phosphorus, arsenic, antimony, bismuth, and/or lithium. N-doped semiconductor layers may supplant silicon with the elements described above regarding p-doped base materials.

Useful hole blocking and/or passivating layers may include, for example, silicon oxide(s), aluminum oxide(s), chromium oxide(s), zinc oxide(s), and/or titanium oxide(s), as well as aluminum chromate, zinc chromate, cadmium chromate, copper chromate, silver chromate, magnesium chromate, and/or tin chromate, nickel fluoride, e.g., at least 50, 60, 70, 75, 80, 85, 90, 91, 92, 92.5, 93, 94, 95, 96, 97, 97.5, 98, 99, 99.1, 99.5, or 99.9 wt. % of a total weight of the passivating/passivation layer, particularly SiO$_2$ and/or Al$_2$O$_3$. Such layers may also be considered or function as hole blocking layers, and/or to limit oxidation of the underlying or adjacent materials. Typical thicknesses may depend upon the compositions used, but a thickness of a monolayer of 0.1 to 0.3 nm may suffice for a noble metal such as platinum (PtO$_2$), 1.5 nm for silicon oxide(s), or 5 nm for aluminum oxide(s), with ranges of up to 1000, 500, 250, 100, 90, 80, 70, 60, 50, 40, 30, 25, 20, 15, 10, 9, 8, 7.5, 7, 6.67, 6, 5, 4.5, 4, 3.5, 3, 2.5, 2, or 1.5-fold these thicknesses being acceptable.

Useful metal oxide layers may include, for example, Ti oxide(s), Zn oxide(s), In oxide(s), Sn oxide(s), W oxide(s), Nb oxide(s), Mo oxide(s), Mg oxide(s), Zr oxide(s), Ce oxide(s), Sr oxide(s), Yr oxide(s), La oxide(s), V oxide(s), Al oxide(s), Y oxide(s), Sc oxide(s), Sm oxide(s), Ga oxide(s), In oxide(s), and/or SrTi oxide(s), e.g., CeO$_2$, ZnO, TiO$_2$, SnO$_2$, WO$_3$, Al$_2$O$_3$, ZrO$_2$, and/or TiSrO$_3$. The metal oxide layer may comprise at least 50, 60, 70, 75, 80, 85, 90, 91, 92, 92.5, 93, 94, 95, 96, 97, 97.5, 98, 99, 99.1, 99.5, or 99.9 wt. % ZrO$_2$, (and/or any others of the above) relative to total metal oxide layer weight. The metal oxide layer may comprise at least 0.00000001, 0.0000005, 0.0000001, 0.0000005, 0.0000001, 0.000005, 0.000001, 0.00005, 0.00001, 0.0005, 0.0001, 0.005, 0.001, 0.05, 0.01, 0.5, or 0.1 at. % Ho$^{3+}$, relative to total metal oxide layer weight, and typically no more than 1, 0.9, 0.8, 0.7, 0.6, 0.5, 0.4, 0.3, 0.2, 0.15, 0.1, 0.05, 0.01, 0.005, 0.001, 0.0001, or 0.00001 at. %. The metal oxide layer may comprise at least 0.00001 at. % Er$^{3+}$ (or any of the aforementioned at. % ranges or values for Ho$^{3+}$) relative to total metal oxide layer weight. The metal oxide layer may comprise at least 0.00001 at. % Tm$^{3+}$ (or any of the aforementioned at. % ranges or values for Ho$^{3+}$) relative to total metal oxide layer weight. Doping treatments may insert 1, 2, or 3 of such rare earth ions into the metal oxide layer. Generally, the doping will take place such that at least 1, 10, 100, 1000, 10000, 100000, or 1000000 foreign atoms/impurities (dopant) is/are present per 1,000,000,000 metal oxide (e.g., ZrO$_2$ molecule) and/or up to contain 1 foreign atom/impurity (dopant) per 1,000, 10,000, 100,000, or 1,000,000 metal oxide (e.g., ZrO$_2$ molecule). A doped-ZrO$_2$ layer (e.g., a "metal oxide" layer) can be disposed at the base between the back contact and the passivating layer, or whether it could be located above the silicon or perovskite layers, relative to incident light. Preferably, the doped-ZrO$_2$ layer is at the bottom (base) but, in some embodiments, it can be above the silicon layer.

The hole blocking and/or silicon-passivating layer may comprise at least 50, 60, 70, 75, 80, 85, 90, 91, 92, 92.5, 93, 94, 95, 96, 97, 97.5, 98, 99, 99.1, 99.5, or 99.9 wt. % SiO$_x$, i.e., silicon oxide(s), and/or Al$_2$O$_3$, relative to total metal oxide layer weight.

In general, the anti-reflection layer may (independently) directly contact the transparent conductive oxide layer, which may (independently) directly contact the hole transport layer, which may (independently) directly contact the perovskite layer, which may (independently) directly contact the p$^+$-doped porous silicon electron transport layer, which may (independently) directly contact the n-type silicon layer, which may (independently) directly contact the n$^+$-doped silicon layer as a homojunction with the n-type silicon layer, which may (independently) directly contact the hole blocking and/or silicon-passivating layer, e.g., comprising SiO$_x$ and/or Al$_2$O$_3$, which may (independently) directly contact the metal oxide layer doped with Ho$^{3+}$, Tm$^{3+}$, and/or Er$^{3+}$ metal oxide, which may (independently) directly contact the conductive electrode layer. That is, the structure sequence as described may, at any interface, involve a direct contact between the named layers. Alternatively, non-functional layers may be included between any of the named layers, if desired, as may functional layers, insofar as technically feasible. The perovskite layer may directly contact the p$^+$-doped porous silicon electron transport layer, and/or the p$^+$-doped porous silicon electron transport layer may directly contact the n-type silicon layer. The metal oxide layer may directly contact the conductive electrode layer. The hole blocking and/or silicon-passivating layer may directly contact the metal oxide layer, and/or the metal oxide layer may directly contact the conductive electrode layer. As noted above, the metal oxide layer may comprise at least 75, 80, 85, 90, 91, 92, 92.5, 93, 94, 95, 96, 97, 97.5, 98, 99, 99.1, 99.5, 99.9, 99.95, 99.99 wt. % or more of ZrO$_2$ and at least 0.000001 at. % (or any other at. % or range discussed above) of Ho$^{3+}$, Er$^{3+}$, and/or Tm$^{3+}$, individually or in combination.

Inventive cells may further comprise a plurality (e.g., at least 1, 2, 3, 4, 5, 6, 7, 8, 9, 10, 15, 20, 25, or 50 and/or 1000, 750, 500, 400, 300, 250, 200, 175, 150, 125, 100, 90, 80, 60, 40, 20, or 10 per cm$^2$) of point contacts bridging the hole blocking and/or silicon-passivating layer and the metal oxide layer. Inventive cells may further comprise a plurality (e.g., at least 1, 2, 3, 4, 5, 6, 7, 8, 9, 10, 15, 20, 25, or 50 and/or 1000, 750, 500, 400, 300, 250, 200, 175, 150, 125, 100, 90, 80, 60, 40, 20, or 10 per $cm^2$) of selective contacts bridging the metal oxide layer and the conductive electrode layer.

Inventive cells may comprise no antireflective layer between a charge transporting layer, light absorbing layers, and/or silicon layer. For example, inventive structures may avoid antireflective layers between the perovskite layer and the porous silicon layer, and/or between the p-doped porous silicon layer and the n-type silicon layer, or the like. Inventive structures may have only the one outermost (relative to incident light) antireflective layer upon the stack, typically topped by a front contact.

The perovskite layer may, for example, comprise a compound of formula (I)

$$RNH_3PbX_3 \quad (I),$$

wherein R is an alkyl group and X is a halide, particularly wherein R is methyl or ethyl and X is Br or I. Further R groups may be propyl, isopropyl, cyclopropyl, allyl, or C3 alkyl groups generally, butyl, isobutyl, s-butyl, cyclobutyl, or C4 alkyl groups generally, pentyl, isopentyl, neopentyl, s-pentyl, cyclopentyl, or C5 alkyl groups generally, etc. The halide may be F, Cl, Br, and/or I, as well as non-integer mixtures of these. The perovskite material may include one or more compounds, e.g., of formula $RNH_3MX_3$ or $HCH(NH_2)_2MX_3$, wherein R may be an alkyl group, such as methyl, ethyl, C3 alkyl, C4 alkyl, C5 alkyl, C5 alkyl, or the like, M is a divalent metal ion, e.g., Pb and/or Sn, X is a halogen, e.g., F, Cl, Br, and/or I, whereby 2 or 3 of the X may be the same halogen, as desired. For example, the perovskite material may include $CH_3NH_3PbI_3$, $CH_3NH_3PbI_xCl_{3-x}$, $CH_3NH_3PbI_xBr_{3-x}$, $CH_3NH_3PbCl_xBr_{3-x}$, $HC(NH_2)_2PbI_3$, $HC(NH_2)_2bI_xCl_{3-x}$, $HC(NH_2)_2PbI_xBr_{3-x}$, $HC(NH_2)_2PbCl_xBr_{3-x}$, $(CH_3NH_3)(HC(NH_2)_2)_{1-y}PbI_3$, $(CH_3NH_3)(HC(NH_2)_2)_{1-y}PbI_xCl_{3-x}$, $(CH_3NH_3)(HC(NH_2)_2)_{1-y}PbI_xBr_{3-x}$, or $(CH_3NH_3)(HC(NH_2)_2)_{1-y}PbCl_xBr_{3-x}$, wherein x or y may be, e.g., at least 0, 0.01, 0.05, 0.1, 0.15, 0.2, 0.25, 0.33, 0.4, 0.45 0.5, 0.55, 0.6, 0.67, 0.75, 0.85, 0.9, 1, 1.1, 1.15, 1.2, 1.25, 1.33, 1.4, or 1.5 and/or up to 2.9, 2.8, 2.75, 2.67, 2.6, 2.5, 2.4, 2.33, 2.25, 2.2, 2.1, 2.05, 2, 1.95, 1.9, 1.85, 1.8, 1.75, 1.7, 1.67, 1.6, 1.55, 1.5, 1.4, or 1.33. Also, useful perovskite materials may include those in which A in $AMX_3$ is partially doped with Cs, Sr, Ba, and/or Rb. Useful perovskite materials may include, e.g., $CH_3NH_3PbI_3$, $CH_3NH_3PbBr_3$, $Cs_2SnI_6$, and/or any described in *J. Phys. Chem. C* 2020, 124(1), 1207-1213, *J. Phys. Chem. Lett.* 2020, 11(1), 333-339, *Chem. Mater.* 2019, 31(20), 8515-8522, *ACS Appl. Mater. & Interf.* 2019, 11(37), 34408-34415, *Chem. Mater.* 2019, 31(17), 6387-6411, *ACS Appl. Mater. & Interf.* 2019, 11(35), 32076-32083, *ACS Sust. Chem. & Eng.* 2019, 7(16), 14217-14224, *Chem. Mater.* 2019, 31(15), 5832-5844, *ACS Appl. Mater. & Interf.* 2019, 11(24), 21627-21633, *ACS Energy Letters* 2019, 4(6), 1370-1378, *J. Phys. Chem. Lett.* 2019, 10(11), 3019-3023, *J. Phys. Chem. C* 2019, 123(19), 12521-12526, *J. Phys. Chem. C* 2019, 123(14), 9629-9633, *ACS Appl. Energy Mater.* 2019, 2(3), 2178-2187, *J. Phys. Chem. Lett.* 2019, 10(6), 1217-1225, *Chem. Rev.* 2019, 119(5), 3418-3451, *J. Phys. Chem. Lett.* 2019, 10(4), 864-869, *J. Am. Chem. Soc.* 2019, 141(3), 1235-1241, *Chem. Mater.* 2018, 30(22), 8280-8290, *J. Phys. Chem. C* 2018, 122(44), 25260-25267, *Chem. Mater.* 2018, 30(19), 6668-6674, *ACS Appl. Mater. & Interf.* 2018, 10(36), 30367-30378, *ACS Appl. Energy Mater.* 2018, 1(8), 3565-3570, *Chem. Mater.* 2018, 30(15), 4959-4967, *Chem. Mater.* 2018, 30(14), 4847-4856, *J. Phys. Chem. C* 2018, 122(25), 13548-13557, *ACS Energy Letters* 2018, 3(6), 1247-1253, *ACS Omega* 2018, 3(3), 2706-2714, *ACS Appl. Energy Mater.* 2018, 1(2), 387-392, *Inorg. Chem.* 2017, 56(24), 14991-14998, *ACS Appl. Mater. & Interf.* 2017, 9(49), 42708-42716, *ACS Appl. Mater. & Interf.* 2017, 9(46), 41006-41013, *ACS Nano* 2017, 11(8), 8072-8083, *J. Phys. Chem. Lett.* 2017, 8(16), 3726-3733, *ACS Energy Letters* 2017, 2(7), 1621-1627, *Nano Lett.* 2017, 17(6), 3563-3569, *J. Phys. Chem. C* 2017, 121(22), 12110-12116, *Inorg. Chem.* 2017, 56(11), 6302-6309, *J. Phys. Chem. Lett.* 2017, 8(7), 1651-1656, *J. Phys. Chem. Lett.* 2017, 8(6), 1211-1218, *J. Phys. Chem. Lett.* 2017, 8(6), 1278-1282, *J. Phys. Chem. Lett.* 2017, 8(1), 67-72, *J. Phys. Chem. Lett.* 2016, 7(18), 3603-3608, *J. Am. Chem. Soc.* 2016, 138(27), 8603-8611, *Nano Lett.* 2016, 16(6), 3563-3570, *Acc. Chem. Res.* 2016, 49(2), 347-354, *Chem. Mater.* 2016, 28(1), 284-292, *Materials Science in Semiconductor Processing* 2020, 109, 104915, *Adv. Energy Mater.* 2020, 10(3), 1902708, *Nature Energy* 2020, 5(1), 35-49, *J. Phys. Chem. Lett.* 2015, 6(13), 2452-2456, *Adv. Funct. Mater.* 2019, 29(49), 1906686, *Nature Comm.* 2019, 10(1) 1088, *Sci. Rep.* 2019, 9(1), 13311, *Sci. Rep.* 2019, 9(1), 17964, *Nature Comm.* 2019, 10(1), 504, *Phys. Rev. Lett.* 2019, 123(15), 5901, *Nanomater.* 2019, 9(10), 1481, *Appl. Phy. A* 2019, 125(8), 575, *J. Mater. Chem. C* 2019, 7(30), 9326-9334, *Nanomater.* 2019, 9(8), 1120, *Org. Electr.* 2019, 69, 343-347, *J. Mater. Chem. C* 2019, 7(18), 5314-5323, *Appl. Phys. A* 2019, 125(4), 229, *Chem. Comm.* 2019, 55(22), 3251-3253, *Solar Energy Mater. Solar Cells* 2019, 191, 451-458, *Nanoscale* 2019, 11(8), 3733-3740, *Adv. Energy Mater.* 2019, 9(3), 1802671, *Adv. Funct. Mater.* 2018, 28(52), 1803753, *Adv. Mater.* 2018, 30(42), 1704587, *Chem. Eur. J.* 2018, 24(47), 12183-12205, *Nat. Sci. Rev.* 2018, 5(4), 559-576, *J. Photochem. Photobiol. C: Photochem. Rev.* 2018, 35, 74-107, *Adv. Sci.* 2018, 5(5), 1700387, *ChemPlusChem* 2018, 83(4), 279-284, *J. Phys. D: Appl. Phys.* 2018, 51(9), 093001, *Renew. Sustain. Energy Rev.* 2018, 82, 2471-2489, *Org. Electr.* 2018, 53, 249-255, *Adv. Energy Mater.* 2018, 8(3), 1700677, *Chem. Comm.* 2018, 54(29), 3640-3643, *J. Mater. Chem. C* 2018, 6(11), 2635-2651, *RSC Adv.* 2018, 8(37), 20952-20967, *J. Mater. Chem. A* 2018, 6(37), 18067-18074, *Renew. Sustain. Energy Rev.* 2017, 77, 131-146, *Nature Energy* 2017, 2(9), 17135, *Solar RRL* 2017, 1(6), 1700038, "Perovskite Materials: Solar Cell and Optoelectronic Applications" in *Encyclopedia of Inorganic and Bioinorganic Chemistry* Yang, et al. Wiley 2017, pp. 1-14, *Adv. Energy Mater.* 2017, 7(6), 1601297, *J. Mater. Chem. A* 2017, 5(23), 11462-11482, *J. Semicond.* 2017, 38(1), 011003, *Nano Energy* 2016, 30, 570-579, *Adv. Electr. Mater.* 2016, 2(11), 1600329, *Energy Environ. Sci.* 2016, 9(2), 323-356, *Energy Environ. Sci.* 2016, 9(6), 1989-1997, *J. Mater. Chem. A* 2016, 4(47), 18378-18382, *Angew. Chem. Int. Ed.* 2015, 54(46), 13806-13810, each of which is incorporated by reference herein in its entirety.

Aspects of the invention provide methods of generating electric energy, which methods may comprise irradiating any permutation of the inventive cell described herein with sunlight. Such methods may involve improvements over similar structures without the metal oxide layer between the back contact and the passivating layer. Inventive methods may involve powering a building or utility infrastructure (street lights, signage, telephones, water pumps, etc.) in an isolated area, particularly in a desert. Useful methods may provide similar performance, e.g., within 5, 4, 3, 2.5, 2, 1.5, 1, or 0.5% conversion efficiency, with or without internal antireflection layers sandwiched anywhere within the functioning layer stacks.

Aspects of the invention provide methods of increasing the electrical conversion efficiency of a tandem perovskite-silicon photovoltaic cell, which method may comprise: including a metal oxide layer doped with $Ho^{3+}$, $Tm^{3+}$, and/or $Er^{3+}$ metal oxide in the cell between a back contact and a passivating layer, beneath a perovskite photoelectric conversion unit and a silicon photoelectric conversion unit in a direction of irradiation. Including the metal oxide layer may involve depositing the metal oxide (e.g., $ZrO_2$) layer, for example, by physical vapor deposition (PVD) methods, including laser pulse ablation, sputtering, energetic ion assist (IAD), etc., chemical vapor deposition (CVD) methods, atomic layer deposition (ALD), UV-enhanced atomic layer deposition (UV-ALD), plasma immersion ion implantation and deposition (PIII&D). Hafnium oxide(s), e.g., $HfO_2$, may supplement or supplant zirconia herein.

Inventive structures need not comprise textured layers and/or surfaces, or each layer may have a surface roughness of less than 0.5, 0.45, 0.4, 0.35, 0.3, 0.25, 0.2, 0.15, 0.1, 0.05, or 0.01 μm average height variation from the deposition plane or morphology height (i.e., twice the arithmetic mean roughness Ra is calculated in accordance with JIS B0601 (2001)). Such maximum morphology height may be a maximum value of morphology heights in observation regions (total 5 $mm^2$) in observation of a region of 1 $mm^2$ square at each of total five positions: at the central part in the surface of the substrate and in the vicinity of the corners of the substrate. No surface of the layers within inventive structures needs to be textured or modified, e.g., by reactive ion etching (RIE) and/or other similar plasma treatment, and such texturing and/or treatments may be avoided on 1, 2, 3, 4, 5, 6, 7, 8, 9, 10, or all layers, such as a transparent conductive oxide layer, silicon-based semiconductor layer (including, e.g., amorphous silicon, microcrystalline silicon such as material including amorphous silicon and crystalline silicon, amorphous silicon alloy, and/or microcrystalline silicon alloy such as silicon oxide, silicon carbide, silicon nitride, and/or silicon germanium), i-type amorphous silicon layer, conductive amorphous silicon layer, and/or an intrinsic silicon-based thin-film layer.

Inventive structures may include a porous silicon layer, which may be an electron transporting layer, directly in contact with a perovskite and/or n-type silicon layer, e.g., without any interlayers, emitter layers, and/or passivation layers, for example of Ti oxide(s), Zn oxide(s), In oxide(s), Sn oxide(s), W oxide(s), Nb oxide(s), Mo oxide(s), Mg oxide(s), Zr oxide(s), Sr oxide(s), Yr oxide(s), La oxide(s), V oxide(s), Al oxide(s), Y oxide(s), Sc oxide(s), Sm oxide(s), Ga oxide(s), In oxide(s), and/or SrTi oxide(s), e.g., ZnO, $TiO_2$, $SnO_2$, $WO_3$, and/or $TiSrO_3$. Passivation layers of inventive structures may be discontiguously arranged between point contacts. Inventive structures need not contain one or more anti-reflection layer and/or transparent conductive layers between the perovskite or first photoelectric conversion unit and the silicon or second photoelectric conversion unit.

Aspects of the invention utilize the up-conversion phenomenon including $Ho^{3+}$, $Tm^{3+}$, and/or $Er^{3+}$ doped metal oxide, particularly $ZrO_2$, in perovskite-silicon tandem solar cell technology. Aspects of the invention comprise using such doped $ZrO_2$ as a selective contact. At least two types of back contacts, i.e. point contact and selective contact, may be implemented with inventive structures. Aspects of the invention include employing selective contacts in inventive structures to bring about further enhancement in the performance of the tandem cell.

Aspects of the invention comprise using inventive perovskite-silicon tandem structures along with point contacts, particularly to provide over 30% efficiency in the conversion of photons to electrical energy. Aspects of the invention involve improving the efficiency of solar cells, particularly of the inventive structures, using selective contacts.

The conduction and valence band edge at the front surface can be tuned via surface modification. A modified silicon surface was used as the electron-transporting material (ETM). Alumina, $Al_2O_3$, or silica, $SiO_x$, was used as a hole blocking layer and silicon was used as a passivating layer. The thickness and optical band gap of the perovskite layer can be tuned for current matching between the perovskite top cell and the Si bottom cell. A highly diffused $n^{++}$ junction was formed on the rear surface of Si. Zirconia doped with the rare-earth ions, $Ho^{3+}$, $Tm^{3+}$, and $Er^{3+}$ was used as a photon upconverter.

A structure as set forth above has the advantage that several processing steps can be omitted. A second advantage is that the parasitic absorption losses due to interface layers can be reduced. A third advantage is that long-wavelength photons can be absorbed near the p-n junction, which can increase the collection efficiency. A fourth advantage is that wide range photons can be utilized for the current generation. A fifth advantage is that the charge carriers can directly enter to Si, thereby reducing the resistive loss, which can enhance the current density of the tandem cell. A sixth advantage is that surface modification of Si can enhance the open-circuit voltage ($V_{oc}$), which can enhance the overall $V_{oc}$ of the tandem cell. A seventh advantage is that the infrared solar spectrum can be used, thereby additionally enhancing efficiency. An eighth advantage is that the conversion efficiency of the tandem solar cell can be enhanced to >30%, which is the best known at present. Additional advantages can include enhancing the stability of the device, and reducing the cost of solar energy.

Referring now to the drawings, wherein like reference numerals designate identical or corresponding parts throughout the several views.

FIG. 1 shows the a plot of the spectral irradiance against wavelength of the solar spectrum, referred to as "AM1.5G," as well as the wavelength overlap with the up-conversion (UC) materials, $Ho^{3+}$, $Tm^{3+}$, and $Er^{3+}$. AM1.5G refers to "air mass" at 1.5 atmosphere of thickness, corresponding to a solar zenith angle of 48.2°, for modelling sunlight not directly (vertically) impacting the ground/solar cell. AM1.5G includes no light at wavelengths 300 to 400 nm, 18.40% light at wavelengths 400 to 500 nm, 19.90% light at wavelengths 500 to 600 nm, 18.40% light at wavelengths 600 to 700 nm, 14.90% light at wavelengths 700 to 800 nm, 12.50% light at wavelengths 800 to 900 nm, 15.90% light at wavelengths 900 to 1100 nm, and no light at wavelengths 1100 to 1400 nm.

Other standard spectra, such as AM1.5D include no light at wavelengths 300 to 400 nm, 16.90% light at wavelengths 400 to 500 nm, 19.70% light at wavelengths 500 to 600 nm, 18.50% light at wavelengths 600 to 700 nm, 15.20% light at wavelengths 700 to 800 nm, 12.90% light at wavelengths 800 to 900 nm, 16.80% light at wavelengths 900 to 1100 nm, and no light at wavelengths 1100 to 1400 nm. AM0, which models the extraterrestrial spectrum, includes 8.00% light at wavelengths 300 to 400 nm, 16.40% light at wavelengths 400 to 500 nm, 16.30% light at wavelengths 500 to 600 nm, 13.90% light at wavelengths 600 to 700 nm, 11.20% light at wavelengths 700 to 800 nm, 9.00% light at wavelengths 800 to 900 nm, 13.10% light at wavelengths 900 to 1100 nm, and 12.20% light at wavelengths 1100 to 1400 nm.

EXAMPLES

Figure 2:
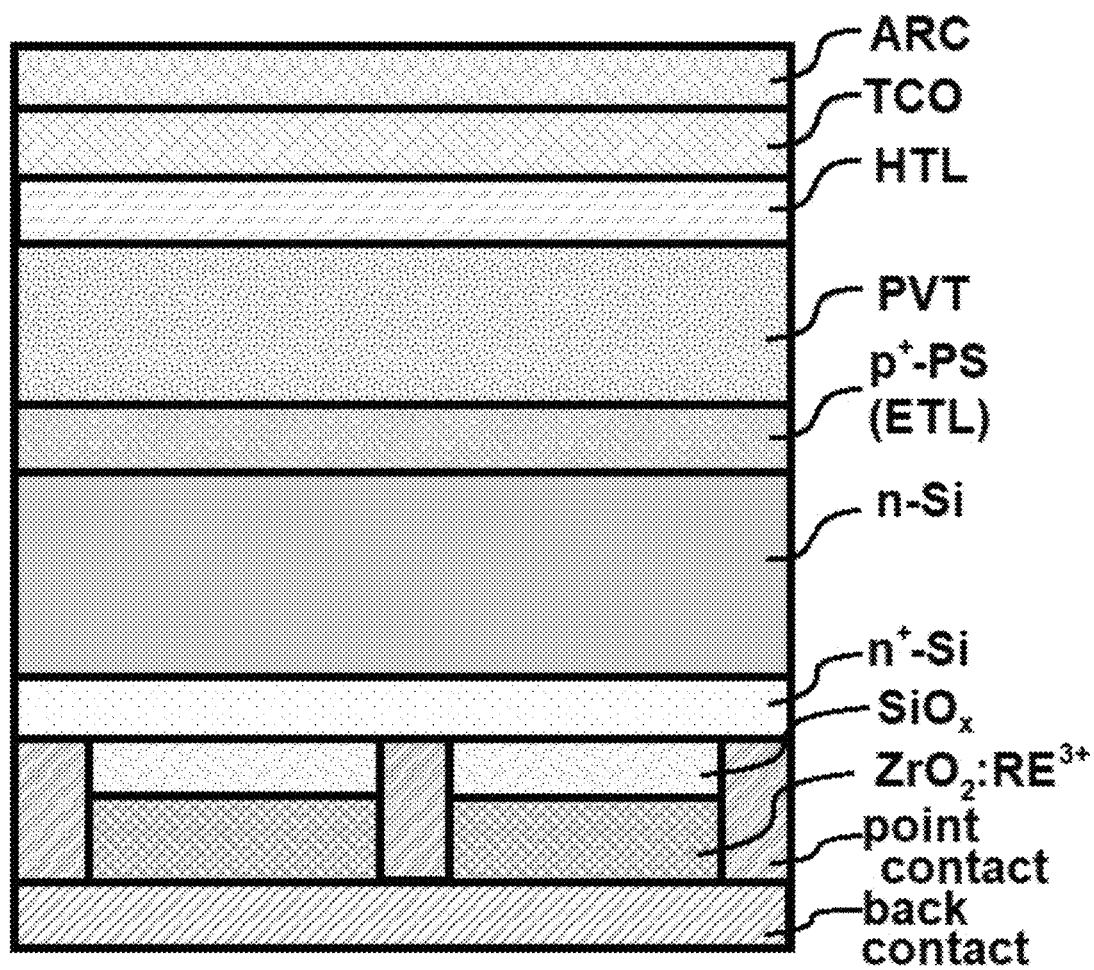
FIG. 2 shows a schematic representation of an exemplary monolithic perovskite (PVT)/Si tandem device for an n-type wafer-based homo-junction silicon solar cell along with upconverters in a point contact configuration.

FIG. 2—N-Type Si Wafer and Point Contact Perovskite-Silicon Tandem Cell Fabrication As seen in FIG. 2, an n-type silicon wafer in a point contact perovskite/silicon tandem solar cell can be fabricated using a polished n-type Si wafer of resistivity 1 to 10 Ωcm, e.g., at least 1, 1.5, 2, 2.5, 3, 3.5, 4, 4.5, or 5 Ωcm and/or up to 10, 9.5, 9, 8.5, 8, 7.5, 7, 6.5, 6, 5.5, or 5 Ωcm, and thickness of around 200 μm (±1, 2, 2.5, 3, 4, 5, 7.5, 10, 15, 20, 25, 30, 40, 50, or 75 μm, or a range including any of these endpoints) as a starting material. The wafers may be cleaned using the Werner Kern, Radio Corporation of America (RCA) cleaning process, involving: firstly removing the organic contaminants, i.e., organic clean plus particle clean, with, e.g., 5 parts of deionized water, 1 part of 29 wt. % $NH_3$ (aq.), and 1 part of 30 wt. % $H_2O_2$ (aq.), secondly removing thin oxide layer(s), with an optional oxide strip, and thirdly removing ionic contamination, i.e., ionic clean, with, e.g., 6 parts of deionized water, 1 part of 37 wt. % HCl (aq.), and 1 part of 30 wt. % $H_2O_2$ (aq.), secondly removing thin oxide layer(s). The front side and back side of the wafer can be simultaneously diffused using a B-source and P-source to create a $p^+$/n junction and $n/n^+$ (low-high) junction. The $SiO_2$ can then be grown of various thicknesses. For example, $SiO_2$ thicknesses can be 0, 5, 10, 15, 20, 25, 30, 35, 40, 45, 50 nm, preferably the thickness ranges from 0 to 10 nm using different known methods. Thereafter, patterned windows can be opened in the $SiO_2$ ($SiO_x$) layer for point contact formation using lithography or nano-lithography. Once the windows are opened, patterned metallic contacts can be prepared on the silicon bottom cell. With the contacts mounted, Any desired rare-earth structure can then be prepared using known methods. The synthesized up-conversion (UC) material. Zirconium(IV) oxynitrate hydrate (ZrO $(NO_3)_2$), Ytterbium(III) nitrate pentahydrate ($Yb(NO_3)_2 \cdot 5H_2O$), Erbium(III) nitrate pentahydrate ($Er(NO_3)_2 \cdot 5H_2O$), Thulium(III) nitrate pentahydrate ($Tm(NO_3)_2 \cdot 5H_2O$), Holmium(III) nitrate pentahydrate ($Ho(NO_3)_3 \cdot 5H_2O$), Polyethylene glycol (PEG), Ammonium hydroxide (NH4OH), Ethanol ($C_2H_5OH$) were used in deionized water. can be heat treated at various temperatures from 300° C., preferably from 500° C. or 750° C. up to 1000° C.] for a various durations, e.g., from 10 minutes to 5 hours under air ambient or inert environment. The layer of up-conversion (UC) material can then be deposited on the layer. Preferably, the layer of up-conversion (UC) materials is deposited on the bottom of doped silicon or on $SiO_2$ layer at the bottom (FIG. 2). Finally, a full metallic contact can be prepared on the rear side of the bottom cell.

An $SiO_2$ and/or $Al_2O_3$ layer of approximately 10 nm (±0.25, 0.5, 0.75, 1, 1.33, 1.5, 1.67, 2, 2.33, 2.5, 2.67, 3, 3.33, 3.5, 3.67, 4, 4.5, or 5 nm, or a range including any of these endpoints) thickness can be deposited via atomic layer deposition (ALD) or sputtering techniques on the porous silicon (PS). A perovskite (PVT) layer can be deposited via chemical vapor deposition (CVD), evaporation, a solution process, or a combination of these. A hole-transporting material (HTM) layer including, e.g., NiO, NiO:Cu, and/or $WO_3$, can be deposited via spin coating or any known method. A front contact comprising one or more transparent conductive oxide (TCO) materials, such as indium tin oxide (ITO), indium zinc oxide (IZO), aluminum-doped zinc oxide (AZO), gallium-doped zinc oxide (GZO), indium cerium oxide (ICO), indium tungsten oxide (IWO), zinc indium tin oxide (ZITO), zinc Indium oxide (ZIO), zinc tin oxide (ZTO), GITO (gallium indium tin oxide), gallium indium oxide (GIO), gallium zinc oxide (GZO), aluminum-doped zinc oxide (AZO), fluorinated tin oxide (FTO), ZnO, or and/or indium-doped cadmium oxide (ICO), can be deposited via thermal evaporation or sputtering.

Figure 3:
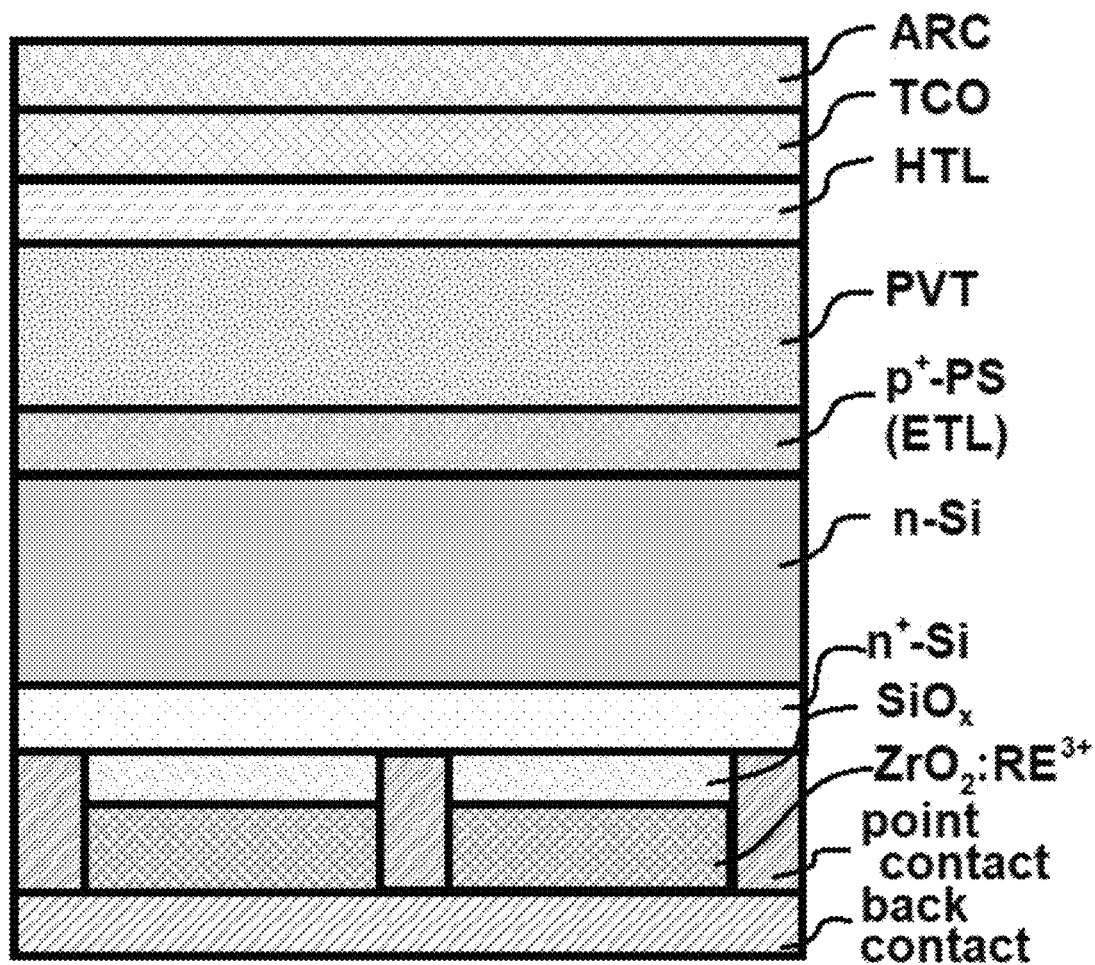
FIG. 3 shows a schematic representation of an exemplary monolithic perovskite (PVT)/Si tandem device for a p-type wafer-based homo-junction silicon solar cell along with upconverters in a point contact configuration.

FIG. 3—P-Type Si Wafer and Point Contact Perovskite-Silicon Tandem Cell Fabrication As seen in FIG. 3, a p-type silicon wafer in a point contact perovskite-silicon tandem solar cell can be fabricated using a polished p-type Si wafer of resistivity 1 to 10 Ωcm (e.g., a resistivity range using any endpoint described above), and thickness of around 200 μm (e.g., a thickness range using any endpoint described above) as a starting material. The wafers can be cleaned using the Werner Kern, Radio Corporation of America (RCA) cleaning process. The front side and back side of the wafer can be simultaneously diffused using a B-source (low doping, $p^+$/p junction) and a P-source to create p/n junction. The $SiO_2$ can then be grown of various thickness (e.g., a range using any endpoint described above) using different methods. Patterned windows can be opened in the $SiO_2$ ($SiO_x$) layer for point contact formation using lithography or nano-lithography. After the opening of the windows, patterned metallic contacts can be prepared on the silicon bottom cell. Any desired rare-earth structure can then be prepared using known methods. The synthesized up-conversion (UC) material as described above can be heat treated at various temperatures (e.g., a temperature range using any endpoint described above) for a various durations (e.g., a time range using any endpoint described above) under ambient or inert environment. After the heat treatment, the layer of the up-conversion (UC) material can be deposited on the $p^+$-doped porous silica layer. The layer of up-conversion (UC) materials can be deposited on the bottom of doped silicon or on $SiO_2$ layer at the bottom (see FIG. 2). Finally, a full metallic contact can be prepared on the rear side of the bottom cell. An $SiO_2$ and/or $Al_2O_3$ layer of roughly 10 nm thickness (e.g., a thickness range using any endpoint described above) can be deposited via atomic layer deposition (ALD) of sputtering techniques on the porous silicon (PS). A perovskite (PVT) layer can be deposition via chemical vapor deposition (CVD), evaporation, or solution process. A hole-transporting material (HTM) layer including, e.g., NiO, NiO:Cu, and/or $WO_3$, can be deposited via spin coating or any known method. A front contact comprising one or more transparent conductive oxide (TCO) materials, such as indium tin oxide (ITO), indium zinc oxide (IZO), aluminum-doped zinc oxide (AZO), gallium-doped zinc oxide (GZO) or and/or indium-doped cadmium oxide (ICO), can be deposited via thermal evaporation or sputtering.

Figure 4:
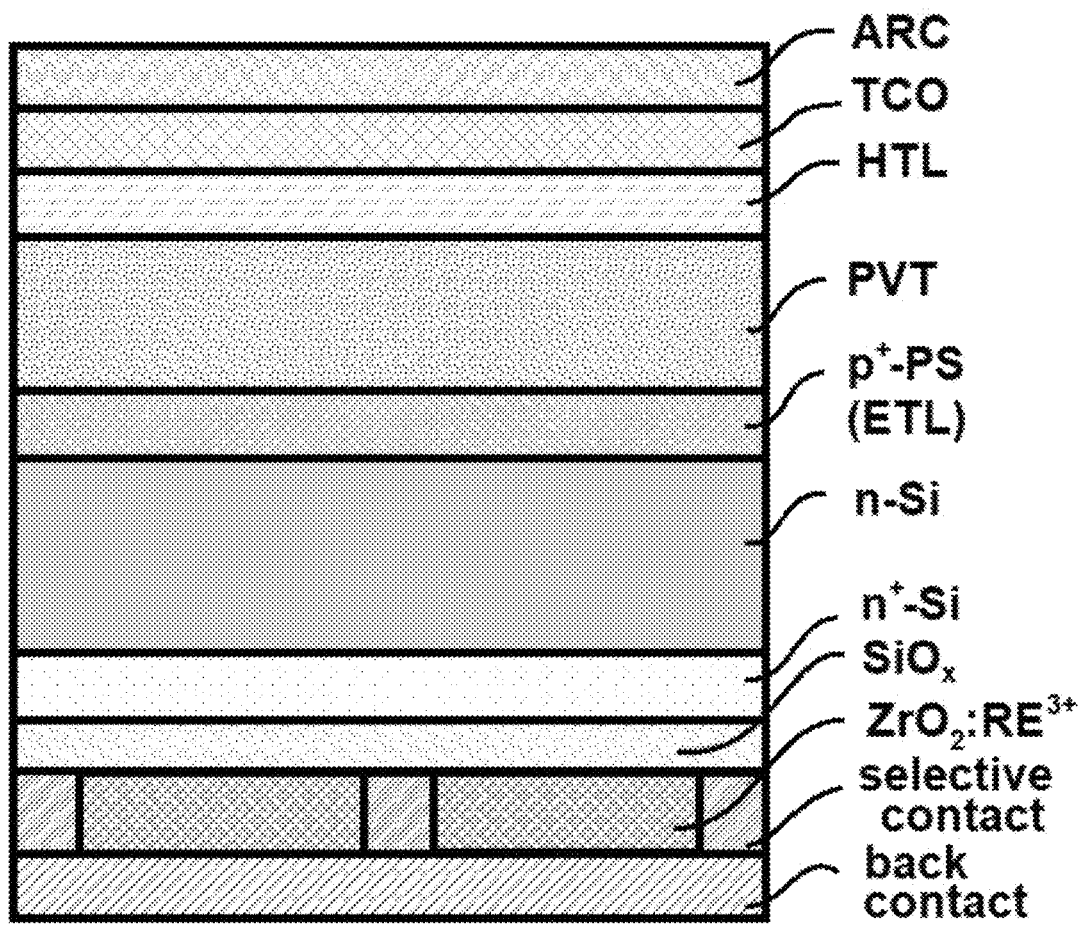
FIG. 4 shows a schematic representation of an exemplary monolithic perovskite (PVT)/Si tandem device for an n-type wafer-based homo-junction silicon solar cell along with upconverters in a selective contact configuration.

FIG. 4—N-Type Si Wafer and Selective Contact Perovskite-Silicon Tandem Cell Fabrication As seen in FIG. 4, a polished n-type Si wafer of resistivity 1 to 10 Ωcm (e.g., a resistivity range using any endpoint described above), and thickness of around 200 μm (e.g., a thickness range using any endpoint described above) as a starting material. The wafers can be cleaned using the Werner Kern, Radio Corporation of America (RCA) cleaning process. The front side and back side of the wafer can be simultaneously diffused using a B-source and a P-source to create a $p^+$/n junction and $n/n^+$ (low-high) junction. The $SiO_2$ can then be grown of various thickness (e.g., a range using any endpoint described above) using different methods. Patterned metallic contacts can be prepared on the silicon bottom cell. Any desired rare-earth structure can then be prepared using known methods. The synthesized up-conversion (UC) material as described above can be heat treated at various temperatures (e.g., a temperature range using any endpoint described above) for a various durations (e.g., a time range using any endpoint described above) under ambient or inert environment. After the heat treatment, the layer of the up-conversion (UC) material can be deposited on the p$^+$-doped porous silica layer. Finally, a full metallic contact can be prepared on the rear side of the bottom cell. An SiO$_2$ and/or Al$_2$O$_3$ layer of roughly 10 nm thickness (e.g., a thickness range using any endpoint described above) can be deposited via atomic layer deposition (ALD) of sputtering techniques on the porous silicon (PS). A perovskite (PVT) layer can be deposition via chemical vapor deposition (CVD), evaporation, or solution process. A hole-transporting material (HTM) layer including, e.g., NiO, NiO:Cu, and/or WO$_3$, can be deposited via spin coating or any known method. A front contact comprising one or more transparent conductive oxide (TCO) materials, such as indium tin oxide (ITO), indium zinc oxide (IZO), aluminum-doped zinc oxide (AZO), gallium-doped zinc oxide (GZO) or and/or indium-doped cadmium oxide (ICO), can be deposited via thermal evaporation or sputtering.

Figure 5:
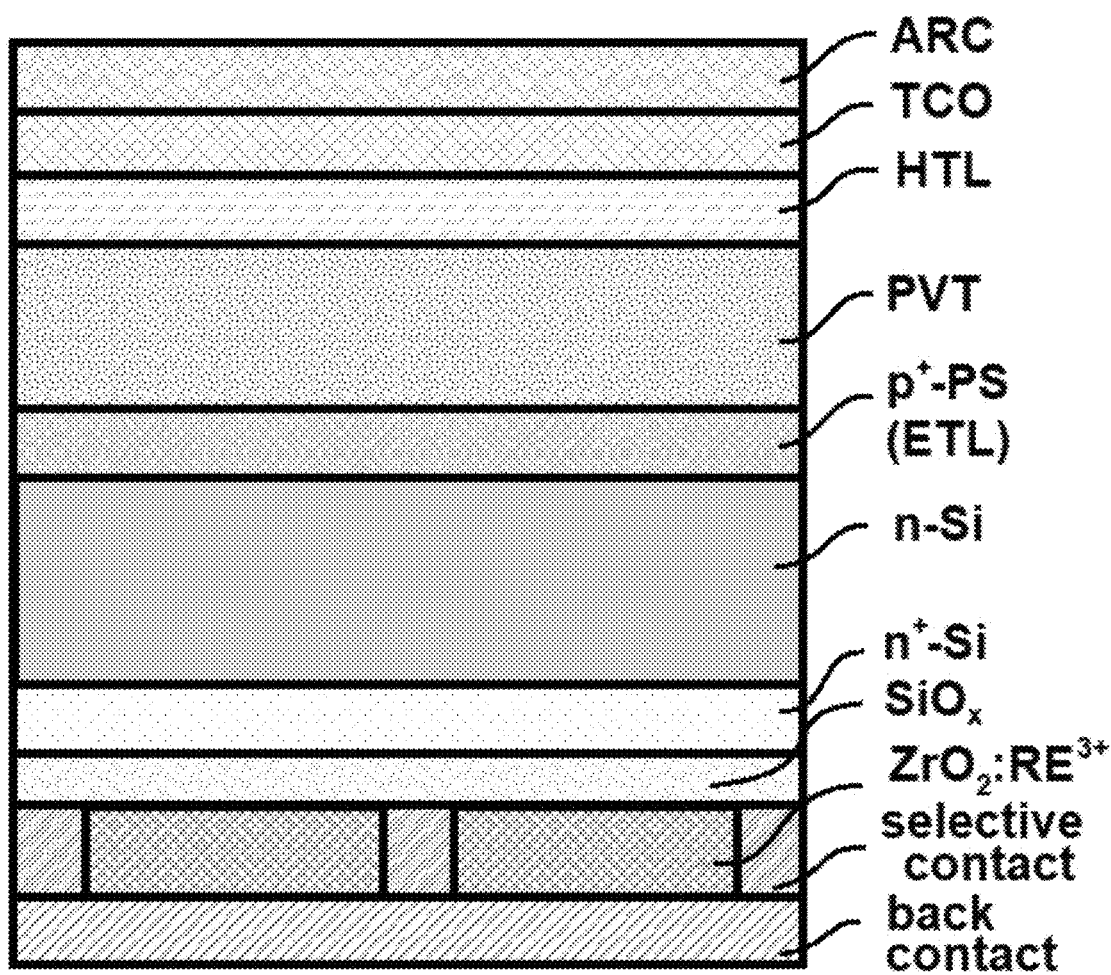
FIG. 5 shows a schematic representation of an exemplary monolithic perovskite (PVT)/Si tandem device for a p-type wafer-based homo-junction silicon solar cell along with upconverters in a selective contact configuration.

FIG. 5—P-Type Si Wafer and Point Contact Perovskite/Silicon Tandem Cell Fabrication As seen in FIG. 5, a polished p-type Si wafer of resistivity 1 to 10 Ωcm (e.g., a resistivity range using any endpoint described above), and thickness of around 200 μm (e.g., a thickness range using any endpoint described above) as a starting material. The wafers can be cleaned using the Werner Kern, Radio Corporation of America (RCA) cleaning process. The front side and back side of the wafer can be simultaneously diffused using a B-source (low doping, p$^+$/p junction) and a P-source to create p/n junction. The SiO$_2$ can then be grown of various thickness (e.g., a range using any endpoint described above) using different methods. Patterned metallic contacts can be prepared on the silicon bottom cell. Any desired rare-earth structure can then be prepared using known methods. The synthesized up-conversion (UC) material as described above can be heat treated at various temperatures (e.g., a temperature range using any endpoint described above) for a various durations (e.g., a time range using any endpoint described above) under ambient or inert environment. After the heat treatment, the layer of the up-conversion (UC) material can be deposited on the p$^+$-doped porous silica layer. Finally, a full metallic contact can be prepared on the rear side of the bottom cell. An SiO$_2$ and/or Al$_2$O$_3$ layer of roughly 10 nm thickness (e.g., a thickness range using any endpoint described above) can be deposited via atomic layer deposition (ALD) of sputtering techniques on the porous silicon (PS). A perovskite (PVT) layer can be deposition via chemical vapor deposition (CVD), evaporation, or solution process. A hole-transporting material (HTM) layer including, e.g., NiO, NiO:Cu, and/or WO$_3$, can be deposited via spin coating or any known method. A front contact comprising one or more transparent conductive oxide (TCO) materials, such as indium tin oxide (ITO), indium zinc oxide (IZO), aluminum-doped zinc oxide (AZO), gallium-doped zinc oxide (GZO) or and/or indium-doped cadmium oxide (ICO), can be deposited via thermal evaporation or sputtering.

Numerous modifications and variations of the present invention are possible in light of the above teachings. It is therefore to be understood that within the scope of the appended claims, the invention may be practiced otherwise than as specifically described herein.

DRAWING LEGEND

ARC anti-reflection coating
TCO transparent conductive oxide
HTL hole-transporting layer
PVT photovoltaic/thermal layer
p$^+$ PS ETL porous silicon electron-transporting layer
RE$^{3+}$ rare earth metal ion in +3 oxidation state
n-Si n-type silicon layer
n$^+$-Si doped n-type silicon layer (a homojunction with n-Si)
SiO$_x$ hole blocking and silicon-passivating layer

The invention claimed is:

1. A tandem photovoltaic cell comprising, in an order as follows:
   an anti-reflection layer;
   a transparent conductive oxide layer;
   a hole transport layer;
   a perovskite layer;
   a p$^+$-doped porous silicon electron transport layer;
   an n-type silicon layer;
   an n$^+$-doped silicon layer as a homojunction with the n-type silicon layer;
   a hole blocking and/or silicon-passivating layer;
   a metal oxide layer doped with Ho$^{3+}$, Tm$^{3+}$, and/or Er$^{3+}$; and
   a conductive electrode layer.

2. The tandem photovoltaic cell of claim 1, wherein the metal oxide layer comprises at least 50 wt. % ZrO$_2$, relative to a total metal oxide layer weight.

3. The tandem photovoltaic cell of claim 1, wherein the metal oxide layer comprises at least 0.00001 at. % Ho$^{3+}$.

4. The tandem photovoltaic cell of claim 1, wherein the metal oxide layer comprises at least 0.00001 at. % Er$^{3+}$.

5. The tandem photovoltaic cell of claim 1, wherein the metal oxide layer comprises at least 0.00001 at. % Tm$^{3+}$.

6. The tandem photovoltaic cell of claim 1, wherein the hole blocking and/or silicon-passivating layer comprises at least 50 wt. % SiO$_x$, and/or Al$_2$O$_3$, relative to a total hole blocking and/or silicon-passivating layer weight.

7. The tandem photovoltaic cell of claim 1, wherein the perovskite layer directly contacts the p$^+$- doped porous silicon electron transport layer.

8. The tandem photovoltaic cell of claim 1, wherein the p$^+$-doped porous silicon electron transport layer directly contacts the n-type silicon layer.

9. The tandem photovoltaic cell of claim 1, further comprising: a plurality of point contacts bridging the hole blocking and/or silicon-passivating layer and the metal oxide layer.

10. The tandem photovoltaic cell of claim 1, further comprising: a plurality of selective contacts bridging the metal oxide layer and the conductive electrode layer.

11. The tandem photovoltaic cell of claim 1, the perovskite layer directly contacts the p$^+$-doped porous silicon electron transport layer, and wherein the p$^+$-doped porous silicon electron transport layer directly contacts the n-type silicon layer.

12. The tandem photovoltaic cell of claim 1, wherein the perovskite layer comprises a compound of formula (I)

$$RNH_3PbX_3 \tag{I}$$

wherein R is an alkyl group and X is a halide.

13. The tandem photovoltaic cell of claim 12, wherein R is methyl or ethyl and X is Br or I.

14. The tandem photovoltaic cell of claim 1, wherein the metal oxide layer directly contacts the conductive electrode layer.

15. The tandem photovoltaic cell of claim 1, wherein relative to a total metal oxide layer weight, the metal oxide layer comprises at least 75 wt. % $ZrO_2$ and at least 0.00001 at. % $Ho^{3+}$, $Er^{3+}$, and/or $Tm^{3+}$.

16. The tandem photovoltaic cell of claim 1, wherein relative to a total metal oxide layer weight, the metal oxide layer comprises at least 75 wt. % $ZrO_2$ and at least 0.00001 at. % $Ho^{3+}$, $Er^{3+}$, and/or $Tm^{3+}$, wherein the hole blocking and/or silicon-passivating layer directly contacts the metal oxide layer, and wherein the metal oxide layer directly contacts the conductive electrode layer.

17. A method of generating electric energy, the method comprising: irradiating the tandem photovoltaic cell of claim 1 with sunlight.

* * * * *